United States Patent [19]

Klaassen

[11] Patent Number: 4,712,144

[45] Date of Patent: Dec. 8, 1987

[54] METHOD AND APPARATUS FOR READING RECORDED DATA BY A MAGNETORESISTIVE HEAD

[75] Inventor: Klaas B. Klaassen, San Jose, Calif.

[73] Assignee: International Business Machines Corporation, Armonk, N.Y.

[21] Appl. No.: 767,549

[22] Filed: Aug. 20, 1985

[51] Int. Cl.$^4$ .......................... G11B 5/02; G11B 5/127
[52] U.S. Cl. ........................................ 360/67; 360/113
[58] Field of Search .................. 360/113, 67; 321/226, 321/252, 207, 208, 260, 261, 262

[56] References Cited

U.S. PATENT DOCUMENTS

| | | | |
|---|---|---|---|
| 3,418,163 | 2/1968 | Oberg et al. | 360/113 |
| 3,493,694 | 2/1970 | Hunt | 360/113 |
| 3,814,863 | 7/1974 | O'Day et al. | 360/113 |
| 4,040,113 | 8/1977 | Gorter | 360/113 |
| 4,191,977 | 3/1980 | Lewkowicz | 360/66 |
| 4,488,194 | 12/1984 | Michel | 360/113 |
| 4,492,997 | 1/1985 | Arai et al. | 360/113 |
| 4,589,038 | 5/1986 | Radtke | 360/113 |

Primary Examiner—Vincent P. Canney
Attorney, Agent, or Firm—F. David LaRiviere; Simon K. Lee

[57] ABSTRACT

Method and apparatus for magnetoresistive (MR) head biasing and output signal detection for reading data recorded in magnetic media. The MR head may be biased by constant current or constant voltage, and an output signal, proportional to the ratio of the instantaneous value of the change in MR head resistance to total MR head resistance when exposed to the magnetic field of the media, is detected.

10 Claims, 6 Drawing Figures

METHOD AND APPARATUS FOR READING RECORDED DATA BY A MAGNETORESISTIVE HEAD

BACKGROUND OF THE INVENTION

1. Technical Field

The present invention relates to retrieval of previously stored data, including data recorded in magnetic media and data stored in magnetic bubble memories, by a magnetroresistive (MR) read head or sensor. The method and apparatus of the present invention involve detection of the instantaneous value of the relative change, $\Delta R_h/R_h$, of the MR head sensor resistance, $R_h$, in two different biasing configurations.

2. BACKGROUND ART

An MR head is an active or parametric transducer which requires an electrical current through its resistive sensor stripe to be active. The current serves as a sensing current for converting the stripe resistance variations produced by the field, Hy, emanating from the medium into voltage variations across the stripe.

The higher the current applied to the head, the larger the readout voltage. The magnitude of the current, however, must be limited to avoid overheating the sensor stripe, and to avoid electromigration of the stripe material. This current should be provided from a low noise source to minimize noise injected into the read channel electronics.

Most existing MR head preamplifiers bias the sensor stripe of the head at a constant bias current, $I_b$, and detect the voltage variation $\Delta V$, (hereafter also referred to as signal voltage, $V_s$), developed at the head terminals. Thus, $$\Delta V = V_s = I_b \Delta R_h, \qquad (A)$$

where $\Delta R_h$ is the absolute change in the head resistance, $R_h$, owing to the magnetic input signal, $H_y$, from the media being read.

Stripe height, the dimension of the sensing stripe perpendicular to the media will vary from device to device because of variations in the lapping process. Stripe height also changes as much as 50% over the life of an MR head in contact recording applications. Since both $R_h$ and $\Delta R_h$ are proportional to stripe height, $\Delta R_h/R_h$ is independent of stripe height. It can also be shown the $\Delta R_h/R_h$ substantially corrects for stripe thickness variations, and fully corrects for variations in stripe length. Thus, prior art preamplifiers which detect $V_s$ of equation (A) provide different sensitivity if switched from one head to another in a multihead storage device or, in contact recording devices, as the stripe height is worn away. Similarly, different sensitivities would be encountered when switching from one sensor to another in bubble memory systems.

$R_h$ typically exhibits a temperature coefficient of about 0.3 to 0.5% per degree C. Thus, as temperature varies, $R_h$ varies according to its particular temperature coefficient. The corresponding variation in $\Delta R_h$ causes low frequency noise modulation of the output signal, $V_s$. Again, since $\Delta R_h$ and $R_h$ are both affected by temperature in the same way, $\Delta R_h/R_h$ is substantially independent of temperature variations.

In other prior art configurations, U.S. Pat. No. 3,814,863 proposes biasing an MR head using resistors having large values with respect to the value of $R_h$, and an AC coupled differential voltage amplifier. U.S. Pat. No. 4,040,113 describes a current source used for biasing a center-tapped MR element and an AC coupled differential voltage amplifier for detecting the output signal produced by the head. Finally, U.S. Pat. No. 4,191,977 describes a method of biasing a center-tapped MR head using two inductors in series with the head and a voltage source with a DC coupled differential voltage amplifier. Thus, the prior art teaches biasing the MR head with a constant bias current and detecting the signal produced across the head with a differential voltage amplifier. The detected signal, which is proportional to $\Delta R_h$, is sensitive to production tolerances, contact recording wear, and temperature variations.

SUMMARY OF THE INVENTION

Biasing and detection of the signal produced by an MR head, center-tapped or not, according to the principles of the present invention may be biased by either a constant current or constant voltage source. For the constant current configuration, MR stripe resistance, $R_h$, is biased by a DC current, $I_b$. Current variations, proportional to the instantaneous value of the relative change, $\Delta R_h$, of $R_h$ as the head detects variations in the magnetization of the recording medium representing data, are then applied to the input of a current sensing differential preamplifier.

In accordance also with the present invention, an MR head also may be biased with a constant DC voltage, $V_b$. The instantaneous value of voltage variations produced by the MR head as it detects data recorded in a magnetic medium are then applied to the input of a voltage sensing differential preamplifier. In either the constant current or constant voltage biasing configurations of the present invention, only the instantaneous value of AC signal produced by the MR head is detected and conditioned by the differential preamplifier.

The instantaneous value of signal produced by the MR head in the two above-described configurations is proportional to $\Delta R_h/R_h$. By so normalizing the signal produced by the MR head, variations in the value of $R_h$ arising in such heads because of manufacturing tolerances and temperature sensitivity are intrinsically corrected. Thus, for example, in a multiple head memory device, switching the signal conditioning circuitry from one head to another, does not require adjustment of the signal conditioning electronics to different levels of gain to accommodate varying detection sensitivities of the heads involved.

DESCRIPTION OF THE PREFERRED EMBODIMENT

Figure 1:
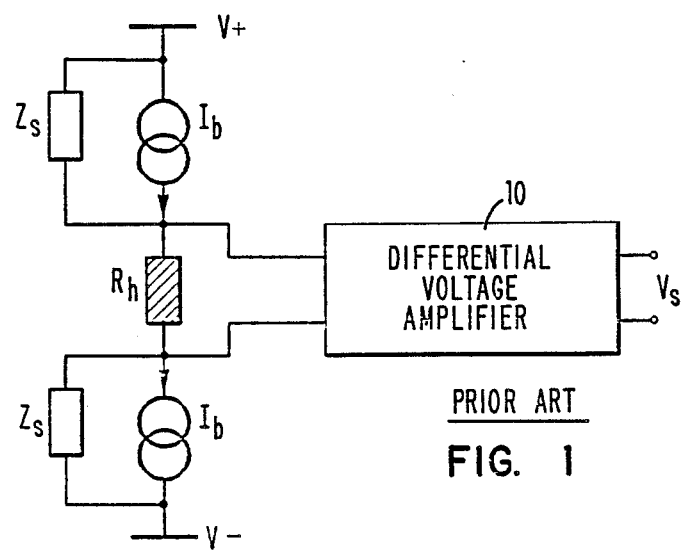
FIG. 1 is a block diagram of MR head biasing and output signal detection according to the prior art.

Referring first to FIG. 1, constant bias current, $I_b$, is supplied to MR head, $R_h$, employed, for example, in a read/write channel for reading data recorded in magnetic media. Impedances Z are the internal impedances of the bias current source. Since voltage amplifier 10 detects the head voltage, $V_s$, given by Equation (A) where $\Delta R_h$ is the absolute change in head resistance $R_h$. The amplifier output, $V_s$, is therefore proportional to $\Delta R_h$. Hence, all other factors causing changes in $R_h$ are also detected. Such other factors interfere with detecting only those changes in $R_h$ which are caused by data bits recorded on a magnetic medium. The large DC voltage component produced by the constant current flowing through $R_h$ may be removed by AC coupling capacitors at the input of amplifier 10.

Since the magnitude of $\Delta R_h$ caused by a certain magnetic excitation is directly proportional to MR head resistance $R_h$, the output signal of amplifier 10 changes as $R_h$ changes with temperature. The temperature coefficient of a typical MR head resistance comprising a permalloy stripe is in the range from 0.3 to 0.5% per degree C. Thus, as much as 10% change in output voltage of amplifier 10 is produced for every 20 degrees C. of ambient temperature change. Since biasing and sensitivity of the MR head is also dependent on production tolerances in $R_h$, adjustment of the bias current for individual head to obtain the same specific read mode sensitivity of the channel would be required.

Figure 2A:
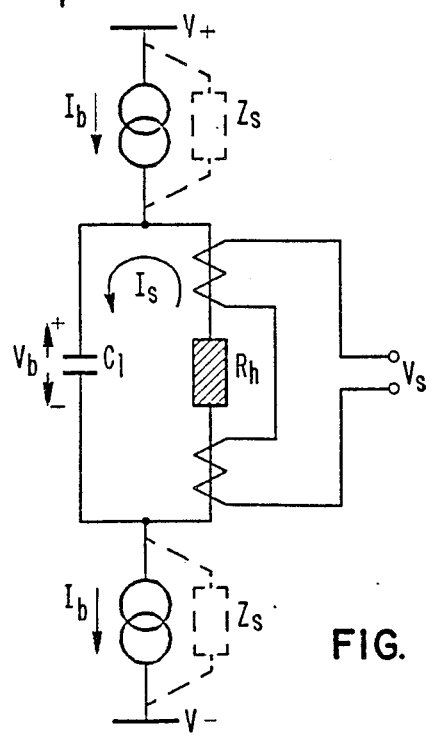
FIG. 2A is a block diagram of MR head constant current biasing and output signal detection according to the principles of the present invention.

FIG. 2A illustrates detection of a signal produced by an MR head, which is proportional to $\Delta R_h/R_h$, according to the present invention. $R_h$ is biased by a constant DC current, $I_b$. $Z_s$ is the internal source impedance of the current sources, $I_b$ where $|Z_s| >> R_h$. AC current variations such as noise, line hum, and the like, produced by the current sources, $I_b$, or supply voltage $V+$ and $V-$, are shorted out by capacitor $C_1$. $C_1$ is large enough so that, $$\tfrac{1}{2}\pi R_h C_1 << F_0,$$

where $F_0$ is the lowest frequency of interest in the signal detection channel.

Dynamic variation of the head resistance from $R_h$ to $R_h + \Delta R_h$ produces a signal current, $I_s$, to flow in the $R_h C_1$ circuit. Any current sensor, such as a toroid current probe transformer can be used to detect $I_s$. Thus, from $$I_s + \frac{V_b}{R_h + \Delta R_h} = \frac{V_b}{R_h} = I_b,$$

it follows that $$I_s = I_b \frac{\Delta R_h}{R_h \cdot \Delta R_h}.$$

If $\Delta R_h$ is small with respect to $R_h$, then $$I_s \approx I_b \Delta R_h / R_h,$$

and output signal, $V_s$, is given by $$V_s \approx K I_b \Delta R_h / R_h,$$

(1)

where K is the sensitivity of the current sensor.

The configuration of FIG. 2A detects a current proportional to the relative resistance change, $\Delta R_h/R_h$. Since the temperature coefficient is cancelled by this technique, $V_s$ is substantially insensitive to temperature changes to which the MR head is subjected. Detection of a voltage proportional to relative resistance change is also insensitive to production tolerances affecting the value of $R_h$. Therefore, $I_b$ need not be adjusted for uniform sensitivity from one head to another, and read mode sensitivity is independent of resistance variations arising during the manufacturing process, or owing to wear during the life of the head in contact recording applications. As shown earlier in this specification, $C_1$ is selected for shorting out noise current produced by the biasing network yet does not limit the bandwidth of the data signals produced by the MR head. Other interference sources at the head/media interface, which cause interference current to flow into or out of the two head terminals, are cancelled by the differential current sensing shown in FIG. 2A. Therefore, this arrangement provides high rejection of common-mode interference.

Figure 2B:
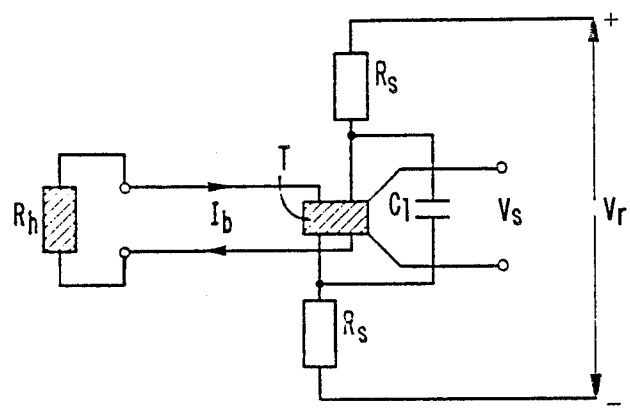
FIG. 2B is a block diagram of another configuration of constant current biasing and output signal detection of the system of FIG. 2A.

In FIG. 2B, $I_b$ is derived from a reference voltage, $V_r$, via matched resistors, $R_s$. If $R_s$ is much greater than $R_h$, the bias current is given by $$I_b = V_r / 2 R_s.$$

Toroid, T, is a ferrite toroid having, any suitable number of recording windings, and a primary winding found by the head leads which are fed thru the toroid so that head signal current adds and common mode currents cancel. Thus, for this configuration according to equation (1), if $$K = 10 \text{ mv/mA}, \ I_b = 10 \text{ mA}, \ \Delta R_h / R_h = 0.5\%, \text{ then}$$
$$V_s = 500 \ \mu v.$$

Figure 3:
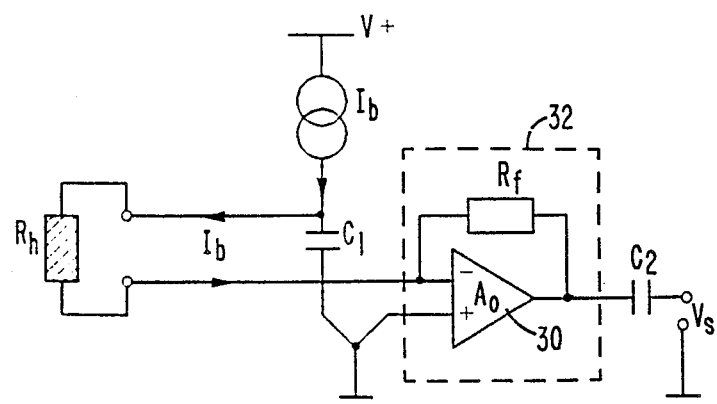
FIG. 3 is a single-ended configuration of the system of FIG. 2A.

Referring now to FIG. 3, a single-ended configuration of the present invention is shown. In this circuit, one side of $R_h$ is grounded by $C_1$ at one input of differential amplifier 30. The combination of amplifier 30 and $R_f$ is current sensing amplifier 32. Coupling capacitor $C_2$ removes the DC component from the output signal, $V_s$. Thus, $$V_s = I_b R_f (\Delta R_h / R_h).$$

For the configuration of FIG. 3, if $R_h$ is 50 ohms and $\Delta R_h / R_h = 0.5\%$ $R_f$ is 500 ohms, C1 is 0.5 $\mu$F, C2 is 0.1 $\mu$F and amplifier 30 is a wideband amplifier, then $V_s$ is 24 mV at $F_0 = 6$ kHz.

Figure 4:
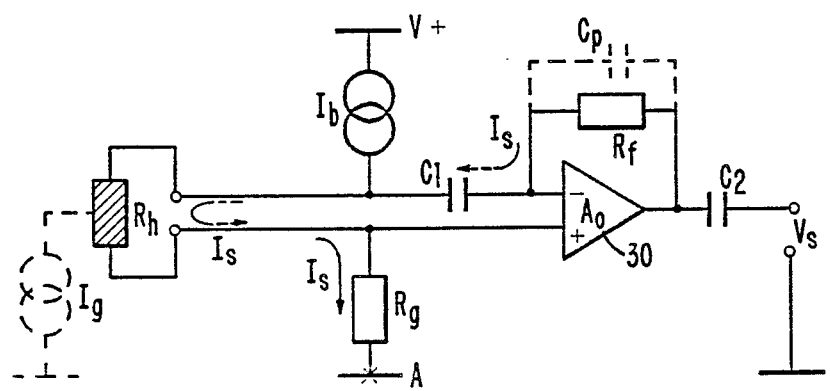
FIG. 4 is a block diagram of a pseudo-balanced configuration of the system of FIG. 2A.

The pseudo-balanced configuration of FIG. 4 is useful in the presence of undesirable stray ground currents which may be injected into the MR head sensing stripe through the slider-to-stripe capacitance. One-half of the injected ground current, $I_g$, will flow through grounding resistor, $R_g$. The other half of $I_g$ will flow through feedback resistor, $R_f$. If $R_g$ and $R_f$ are matched or otherwise substantially equal, the voltage developed by the flow of one-half $I_g$ through each of these resistors will be cancelled at the amplifier output since they are of opposite phase. Thus, stray ground current, $I_g$, does not contaminate $V_s$.

For the configuration of FIG. 4, if $R_h$ changes by an amount $\Delta R_h$, the resulting signal current is given by $$I_s = -I_b (\Delta R_h / R_h).$$

Current $I_s$ is supplied from feedback resistor $R_f$ and flows through $R_g$ to ground. Thus, $$V_s = -2I_b R_f (\Delta R_h / R_h).$$

For the configuration of FIG. 4, with $I_b=10$ mA, $\Delta R_h/R_h=0.5\%$, $I_s=50$ μA and $V_s=-50$ mV if $C_1=0.5$ μF, $C_2=0.1$ μF, $R_f=500$ ohms and amplifier 30 is a wideband amplifier, such as an MC1733, manufactured by Motorola.

Figure 5:
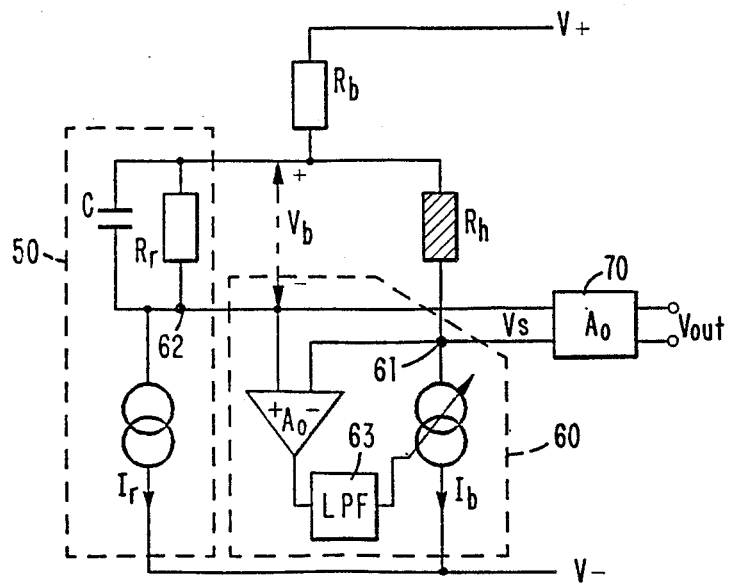
FIG. 5 is a block diagram of MR head constant voltage biasing and output signal detection according to the principles of the present invention.

Referring now to FIG. 5, for constant voltage biasing of an MR head according to the present invention, model reference 50 comprises a fixed current source, $I_r$, a resistor, $R_r$ and capacitor, C. Voltage $V_b$, given by the product of $I_r$ and $R_r$, provides the reference for bias voltage across MR head resistor, $R_h$. Since capacitor C forms a short circuit for all data frequencies, the input of voltage amplifier 70 is effectively coupled across MR head resistance, $R_h$. Capacitor C also shorts out all noise produced by resistor $R_r$. Thus, signal amplifier 70 detects and amplifies the instantaneous value of the voltage, $V_s$, produced by the MR head according to the relation $$V_s = V_b \frac{\Delta R_h}{R_h}.$$

Bias feedback loop 60 offsets $V_b$ by driving the potential of $R_h$ lead 61 to the same potential as $R_r$ lead 62. The operating frequency range of bias feedback loop 60 is determined by low pass filter 63 which is designed to pass only DC And very low frequencies.

I claim:

1. A method for detecting magnetic fields having encoded information, comprising the steps of:
   (a) exposing a magnetoresistive element to the magnetic fields; and
   (b) directly sensing the ratio of the instantaneous value of change in the resistance of the magnetoresistive element to the total resistance of the magnetoresistive element.

2. A method as in claim 1, wherein said directly sensing step (b) comprises the steps of:
   (a) providing a current through the magnetoresistive element, said current having a constant time average value; and
   (b) detecting current deviations from said constant time average value produced by said magnetic fields.

3. A method as in claim 1, wherein said directly sensing step (b) comprises the steps of:
   (a) providing a voltage to the magnetoresistive element to produce a current therethrough, said voltage having a constant time average value;
   (b) detecting voltage deviations from said constant time average value produced by said magnetic fields.

4. A circuit for detecting magnetic fields having encoded information, comprising:
   (a) a magnetoresistive element; and
   (b) means for directly sensing the instantaneous value of change in the resistance of said magnetoresistive element relative to the total resistance of the magnetoresistive element.

5. A circuit as in claim 4, wherein said directly sensing means (b) comprises:
   (a) a current source coupled to the magnetoresistive element to produce a current therethrough whose time average value is constant; and
   (b) detector means for detecting current deviations from said constant time average value, said deviations being produced by exposing said magnetoresistive element to the magnetic fields.

6. A circuit as in claim 4, wherein said directly sensing means (b) comprises:
   (a) a voltage source coupled to the magnetoresistive element to produce a current therethrough, said voltage source having a constant time average value; and
   (b) detector means for detecting voltage deviations from said constant time average value, said deviations being produced by exposing said magnetoresistive element to the magnetic fields.

7. A method for detecting magnetic fields having encoded information, comprising the steps of:
   (a) exposing a magnetoresistive element to the magnetic fields;
   (b) directly sensing the ratio of the instantaneous value of change in the resistance of said magnetoresistive element relative to the total resistance of the magnetoresistive element, comprising the steps of:
      (i) providing a current through the magnetoresistive element, said current having a constant time average value; and
      (ii) detecting current deviations from said constant time average value produced by said magnetic fields; and
   (c) amplifying the instantaneous value of the current deviations, $I_s$, substantially according to the relation $$I_s = I_b \frac{\Delta R_h}{R_h}, \text{ where } I_b \text{ is}$$

the current provided by the bias current source, $R_h$ is the absolute value of the magnetoresistive element, and $\Delta R_h$ is the instantaneous value of the magnetoresistive element in the presence of the magnetic fields.

8. A method for detecting magnetic fields having encoded information, comprising the steps of:
   (a) exposing a magnetoresistive element to the magnetic fields;
   (b) directly sensing the ratio of the instantaneous value of change in the resistance of said magnetoresistive element relative to the total resistance of the magneto resistive element, comprising the steps of:
      (i) providing a voltage to the magnetoresistive element to produce a current therethrough, said voltage having a constant time average value; and
      (ii) detecting voltage deviations from said constant time average value produced by said magnetic fields; and
   (c) amplifying the instantaneous value of the voltage deviations, $V_s$, substantially according to the relation $$V_s = V_b \frac{\Delta R_h}{R_h}, \text{ where } V_b \text{ is}$$

the voltage provided by the bias voltage source, $R_h$ is the absolute value of the magnetoresistive element and $\Delta R_h$ is the instantaneous value of the magnetoresistive element in the presence of the magnetic fields.

9. A circuit of detecting magnetic fields having encoded information, comprising:
   (a) a magnetoresistive element;
   (b) means for directly sensing that instantaneous value of change in the resistance of said magnetoresistive element relative to the total resistance of the magnetoresistive element, comprising:
      (i) a current source coupled to the magnetoresistive element to produce a current therethrough whose time average value is constant; and
      (ii) detector means for detecting current deviations from said current time average value, said deviations being produced by exposing said magnetoresistive element to the magnetic fields; and
   (c) amplifier means for amplifying the instantaneous value of the current deviations, $I_s$, substantially according to the relation $$I_s = I_b \frac{\Delta R_h}{R_h}, \text{ where } I_b \text{ is}$$

the current provided by the bias current source, $R_h$ is the absolute value of the magnetoresistive element, and $\Delta R_h$ is the instantaneous value of the magnetoresistive element in the presence of the magnetic fields.

10. A circuit of detecting magnetic fields having encoded information, comprising:
    (a) a magnetoresistive element;
    (b) means for directly sensing the instantaneous value of change in the resistance of said magnetoresistive element relative to the total resistance of the magnetoresistive element, comprising:
       (i) a voltage source coupled to the magnetoresistive element to produce a current therethrough, said voltage source having constant time average value; and
       (ii) detector means for detecting voltage deviations from said constant time average value, said deviations being produced by exposing said magnetoresistive element to the magnetic fields; and
    (c) amplifier means for amplifying the instantaneous value of the voltage deviations, $V_s$, substantially according to the relation $$V_s = V_b \frac{\Delta R_h}{R_h}, \text{ where } V_b \text{ is}$$

the voltage provided by the bias voltage source, $R_h$ is the absolute value of the magnetoresistive element and $\Delta R_h$ is the instantaneous value of the magnetoresistive element in the presence of the magnetic fields.

* * * * *